US006888349B2

(12) United States Patent
Fautz

(10) Patent No.: US 6,888,349 B2
(45) Date of Patent: May 3, 2005

(54) NUCLEAR MAGNETIC RESONANCE (NMR) MULTI-SLICE IMAGING HOMOGENEOUS PREPARATION ENCODING (HOPE)

(75) Inventor: Hans-Peter Fautz, Freiburg (DE)

(73) Assignee: Universitätsklinikum Freiburg (DE)

( * ) Notice: Subject to any disclaimer, the term of this patent is extended or adjusted under 35 U.S.C. 154(b) by 193 days.

(21) Appl. No.: 10/255,055

(22) Filed: Sep. 24, 2002

(65) Prior Publication Data

US 2003/0073897 A1 Apr. 17, 2003

(30) Foreign Application Priority Data

Oct. 11, 2001 (DE) .......................................... 101 50 133

(51) Int. Cl.[7] ................................................. G01V 3/00
(52) U.S. Cl. ..................................... 324/309; 324/307
(58) Field of Search ............................... 324/309, 307, 324/306

(56) References Cited

U.S. PATENT DOCUMENTS 6,272,369 B1 * 8/2001 Tan ............................ 600/410

OTHER PUBLICATIONS

Magnetic Resonance in Medicine 43:577–582 (2000) "TSE–Sequences With Spin–Echo Contrast".

* cited by examiner

Primary Examiner—Brij B. Shrivastav
(74) Attorney, Agent, or Firm—Walter A. Hackler

(57) ABSTRACT

A multi-slice NMR imaging method for recording N slices (N>1) from a measuring object, wherein for complete image reconstruction, an acquisition in m (m>1) repetition steps with different spatial encoding is used, with a magnetization preparation in the form of a saturation pulse which is selective with respect to chemical shift and which is applied P times ($1 \leq P < N$) in each repetition step such that through each of these chemical shift selective saturation pulses the spins to be saturated of one of the N slices in the measuring object are optimally saturated and consequently the signals of N–P slices are saturated only sub-optimally, is characterized in that the temporal sequence of the saturation pulses and/or the sequence of the acquisition of the differently spatially encoded signals of the individual slices is permuted such that after termination of the acquisition, for each slice the signals with identical spatial encoding were recorded in the same fashion also with respect to saturation preparation. This produces uniform fat or water suppression for all slices.

20 Claims, 3 Drawing Sheets

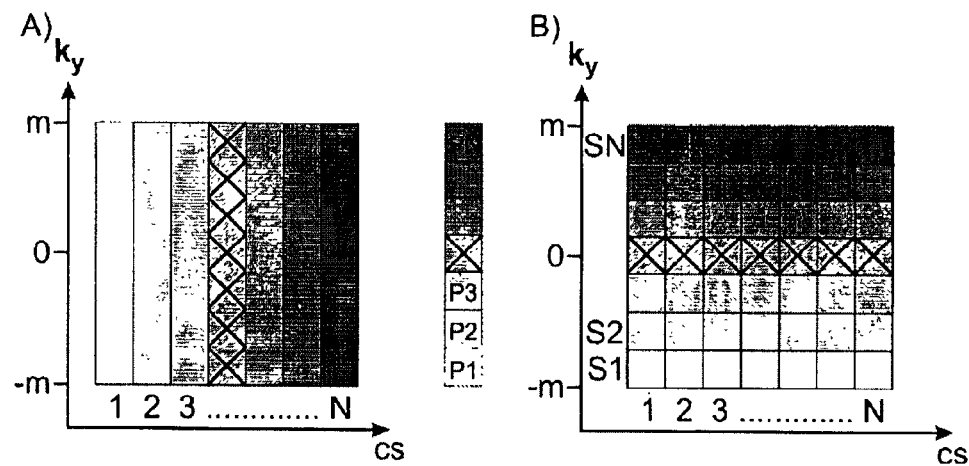
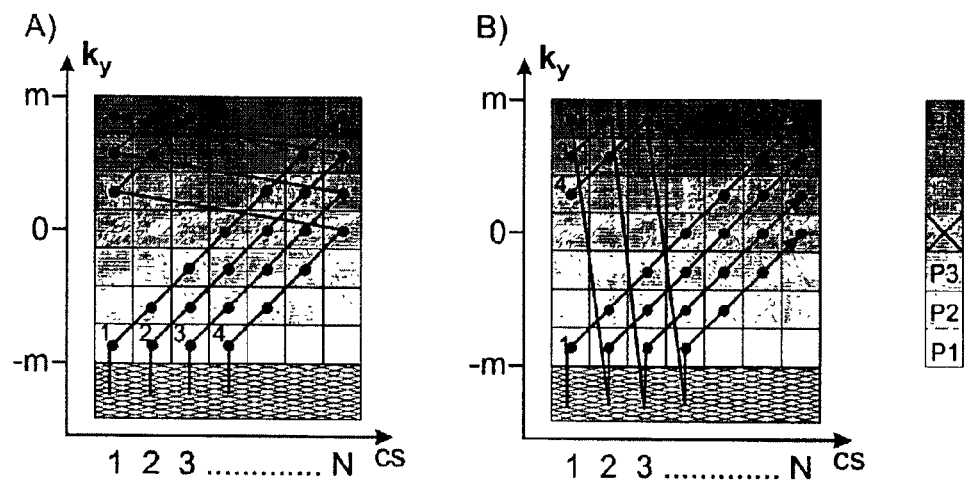
FIG.2

NUCLEAR MAGNETIC RESONANCE (NMR) MULTI-SLICE IMAGING HOMOGENEOUS PREPARATION ENCODING (HOPE)

This application claims Paris Convention priority of DE 101 50 133.1 filed Oct. 11, 2001 the complete disclosure of which is hereby incorporated by reference.

BACKGROUND OF THE INVENTION

The invention concerns a nuclear magnetic resonance (NMR) multi-slice imaging method for recording N slices (N>1) from a measuring object, wherein for complete image reconstruction, an acquisition is used in m (m>1) repetition steps with different spatial encoding each, with a magnetization preparation in the form of a saturation pulse which is selective with respect to chemical shift and which is applied P times ($1 \leq P < N$) in each repetition step such that through each of these chemical shift selective saturation pulses the spins to be saturated of one of the N slices in the measuring object are optimally saturated and consequently the signals of N–P slices are saturated only sub-optimally.

A method of this type is e.g. known from the publication by Rosen B R, Wedeen V J, Brady T J. "Selective saturation NMR imaging", J Comput Assist Tomogr; 8:813–818; 1984 mentioned in the appended reference list under [2].

Imaging nuclear magnetic resonance tomography obtains two-dimensional slice images from an object to be investigated. A volume is imaged by recording sets of parallel slices which extend in the spatial direction orthogonal to these slices.

Recording of an image requires in general m partial steps, wherein n complex data points are acquired in each case. The image reconstruction from the m×n data points is carried out by means of two-dimensional Fourier transformation (2DFT). Between two partial steps, the so-called phase encoding steps (PE steps), the magnetic field is varied in each case through temporally varying magnetic field gradients. Generally, a slice is excited several times to acquire several phase encoding steps. The time between two excitations, the so-called repetition time TR, is in the order of magnitude of NMR relaxation times and determines the image contrast.

Frequency-selective (narrow-band) RF pulses, which are irradiated at a constant magnetic field gradient, permit selective excitation of slices of a certain thickness. One class of methods is called multi-slice imaging wherein a number of N slices is successively excited and read out within a repetition time TR. All slices are excited in the same order in each repetition step. Spatial encoding is different in the individual repetition steps [1]. The time interval between two subsequent excitations of the same slice equals the repetition time TR=N*TA for all slices, when TA is the time required for acquiring a phase encoding step. All N slices are recorded in almost the same acquisition time, which is required for recording one slice.

The Larmor frequency of the protons bound in the fat molecules varies by 3.4 ppm from the free protons or those bound in water. This so-called chemical shift makes it principally possible to produce separate water or fat images, which contain only one of the two spectral components each. A commonly used method of obtaining water images is the so-called fat saturation by means of chemical shift selective RF pulses.

Magnetization of the fat molecules is deflected into the transverse plane and spoiled by gradient pulses directly before spatial (slice) selective excitation by means of a chemical shift selective pulse. After this preparation, which consists of application of a fat saturation pulse and spoiler gradients, the slice excitation acting on both spectral components and the actual data acquisition of the remaining water signal are carried out [2].

For most sequences, fat saturation preparation is placed directly before each spin echo or gradient echo acquisition. Other techniques such as fat saturated multiple spin echo sequences read out larger parts of the k space after only one preparation [3].

A faster variant can also be used for multi slice recordings. Fat saturation preparation before each acquisition of a phase encoding step of each slice is dispensed with. At the start of each repetition only one preparation is applied. Subsequently, all slices are excited one after the other before applying the next preparation in a following repetition time. A set of water or fat images can be recorded in approximately the same time as the corresponding combined images [2,4,5].

The time interval between preparation and excitation of a certain slice is different for the different slices. The magnetization deflected by fat saturation preparation experiences different longitudinal orientation for different times due to T1 relaxation. Each slice is acquired in a different preparation state. Fat suppression can be optimized only for one slice by exciting this slice at the point in time during the repetition time when the longitudinal magnetization of the fat protons is zero. The other slices show reduced fat suppression corresponding to T1 relaxation and the order of slice excitation.

In contrast thereto, it is the object of the present invention to improve a method of the type described in the beginning such that the above-discussed disadvantages can be avoided. The invention shall present in particular a new method aiming for fat or water suppression, which is uniform for all slices.

SUMMARY OF THE INVENTION

This object is achieved in accordance with the invention in that the temporal sequence of the saturation pulses and/or the order of acquisition of the differently spatially encoded signals of the individual slices is permuted such that after termination of the acquisition, for each slice the signals with identical spatial encoding were acquired in the same fashion also with respect to saturation preparation.

Towards this end, in some cases a multi slice recording technique is used which has been modified in view of prior art and was used per se by Norris [6] and Herlihy [7] with different objectives. It can be applied for all conventional multi-slice methods.

In one variant of the inventive method the permutation of the order of the acquisition of the differently spatially encoded signals of the individual slices is carried out such that the scheme of the temporal sequence between saturation pulses and the acquisition of the repetition step is maintained during all m repetition steps wherein the sequence of the individual spatial encoding steps and the allocation of the N recording steps acting on the individual slices to the respective slices are varied.

In an alternative, particularly preferred variant, the temporal sequence of the acquisition steps of the individual slices is maintained during the m acquisition steps and permutation of the sequence of the acquisition of the differently spatially encoded signals of the individual slices is carried out through corresponding change of the point in time of application of the preparation steps relative to the acquisition steps of the individual slices.

In a particularly preferred variant of the inventive method, RF pulses are irradiated and temporally varying magnetic gradient fields are selected for spatial encoding according to the principle of the spatially resolved n-dimensional Fourier transformation method. This permits particularly simple reconstruction of spatially resolved images from the recorded NMR signals.

In a simple variant of the inventive method, classical spin echo sequences are used.

A further advantageous method variant is characterized by the use of a gradient echo sequence, which can be either spoiled-FLASH, refocused FLASH, reversed FLASH or TrueFISP.

Finally, in an alternative and likewise also advantageous variant of the inventive method, RARE- (TSE-) sequences are used such that several differently spatially encoded pieces of data are acquired in each individual step.

Further advantages of the invention can be extracted from the description and the drawing. The features mentioned above and below can be used in accordance with the invention either individually or collectively in any arbitrary combination. The embodiments shown and described are not to be understood as exhaustive enumeration but rather have exemplary character for describing the invention.

The invention is shown in the drawing and explained in more detail with reference to embodiments.

The individual illustrations show:

BRIEF DESCRIPTION OF THE DRAWING

FIG. 1 preparation states of the phase encoding steps in a conventional (left) and a HoPE (right) multi-slice acquisition. The preparation states P1, P2, . . . , PN are encoded in gray. After the HoPE acquisition order, the phase encoding steps are divided into N equally sized segments S1, S2, . . . , SN. The segmentation is typically linear. The segments are associated with preparation states (herein linearly). The preparation state, which encodes the desired contrast, is marked with an X and is associated with the central k space segment.

FIG. 2 acquisition trajectories for different repetitions of a HoPE multi-slice experiment. The black arrows exemplarily connect one phase encoding step each of each segment in the temporal sequence of their acquisition. The applied preparations are integrated in the trajectory corresponding to their application times through the hatched fields. In the method shown on the left-hand side, the preparation is applied at the beginning of each repetition after N acquisition steps in each case. The order of slice excitations within one repetition changes during the repetitions in the numbered order. In the method shown on the right-hand side, the temporal order of the slice excitation remains constant within one repetition throughout all repetitions. The point in time when the preparation is applied within one repetition changes during the repetitions in the order stated.

FIG. 3A uses the trajectories shown in FIG. 2A. The sequence of slice excitation is permuted during the repetitions. FIG. 3B uses the trajectories shown in FIG. 2B. The sequence of slice excitation remains the same for all repetitions. The point in time of the preparation within the repetitions is shifted during the repetitions.

DESCRIPTION OF THE PREFERRED EMBODIMENT

Figure 3:
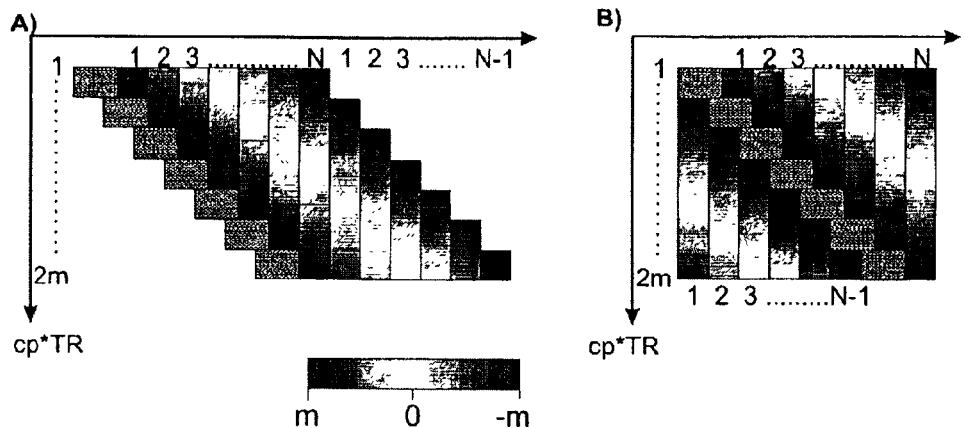
FIG. 3 complete temporal developments of a HoPE recording. The temporal acquisition sequence of the gray encoded phase encoding steps runs from the left to the right and from the top to the bottom. Hatched boxes represent the preparations.

In a multi-slice experiment with N slices, there are N different acquisition times within a repetition time. With respect to the temporal separation from a chemical shift selective saturation, these acquisition times N correspond to different preparation states P1, P2, . . . , PN.

According to the conventional acquisition scheme, all phase encoding steps of a slice have the same preparation state each (FIG. 1A). However, different slices are acquired in different preparation states. Each slice therefore has a different contrast with respect to the preparation.

The principal idea of HoPE is the encoding of identically prepared signals for identical phase encoding lines of all slices. In contrast to the conventional method, identical phase encoding steps from different lines must be acquired in different repetitions. All slices have identical image characteristics with respect to fat or water saturation under the following HoPE condition. All phase encoding steps with the same $k_y$ value must have the same preparation state for all slices. Phase encoding steps with the desired preparation contrast are encoded in the center of the k space (FIG. 1B).

Towards this end, the 2 m phase encoding steps -m, . . . , m must be divided into N segments S, S2, . . . , SN to which one preparation state is associated in each case. Since each preparation state is acquired once in each repetition of a multi-slice recording, all preparation states are acquired equally frequently during the repetitions. The N segments therefore have identical sizes and each contain m/N phase encoding steps.

The HoPE conditions are graphically summarized in FIG. 1B. All phase encoding steps of a segment have the same preparation state. The phase encoding steps of different segments have different preparation states. All phase encoding steps of a certain $k_y$ value have the same preparation state for all slices. The phase encoding steps of the central k-space segment are acquired in the preparation state with the desired contrast.

To realize the HoPE conditions in a multi-slice sequence, two conditions must be met for the acquisition sequence of the phase encoding steps. At first, all slices must be subsequently read out in each repetition and thus be acquired in another preparation state each. Secondly, after 2 m repetitions, all phase encoding steps of all slices must be acquired. The first condition may be met e.g. by a trajectory, plotted in FIG. 1B, which connects phase encoding steps, subsequently acquired in one repetition, diagonally.

There are two principally different possibilities of selecting the trajectories. If the chemical shift selective saturation is applied after N slice excitations each at the beginning of a repetition, the sequence of slice excitation within one repetition is permuted for the different trajectories (FIG. 2A).

Another possibility is to keep the sequence of slice excitations constant within a repetition during the repetitions. In this case, the point in time of application of the preparation must be shifted within a repetition during the repetitions. This produces the trajectories shown in FIG. 2B.

Hybrid versions are also feasible which permute the sequence of the slice acquisition and also change the point in time of application time of the preparation.

The complete temporal HoPE sequences used by the two methods A and B shown in FIG. 2, are represented correspondingly to the FIGS. 3A and 3B. The time axis of the acquisition extends from the left to the right and from the top to the bottom. In both sequences, the acquisition conditions of the multi-slice technique are met (all slices are acquired in each repetition and all phase encoding steps of each slice are completely acquired during the repetitions).

The HoPE conditions are exactly met in method A, and are only approximately met in method B. In variant B, the first phase encoding steps of the segments left of the preparation have a different preparation state than the other phase encoding steps of these segments. The time interval between the chemical shift selective saturation and the acquisition of a phase encoding step differs for these phase encoding steps by the acquisition time TA of a phase encoding step since the time interval refers to the preparation of the previous repetition.

Figure 4:
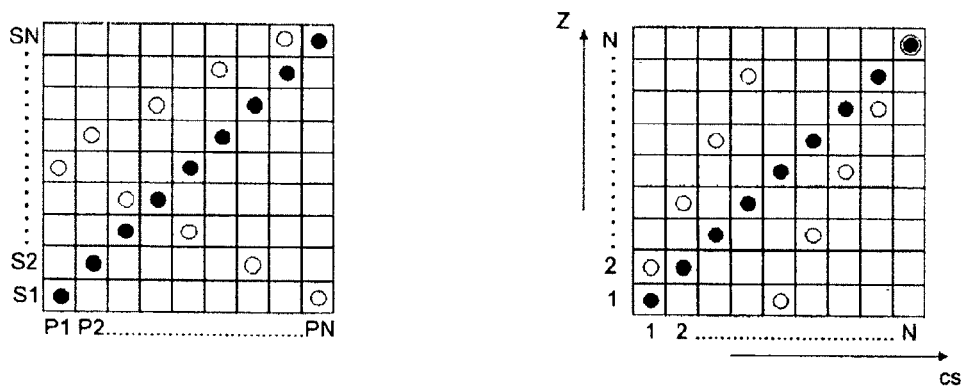
FIG. 4 look-up tables for allocation of the preparation states P1 . . . PN to the k spatial segments S1 . . . SN (left) and the slice counter cs to spatial slice positions z (right), wherein the filled circles in the left figure mean "linear", in the right figure "continuous" and the unfilled circles in the left figure mean "centric", in the right figure "interleaved".

The linear allocation of the preparation states to the segments of the k space of FIG. 1B is only one possibility. In general, each preparation state can be associated with any k-space segment (FIG. 4; left). Contrasts can be produced flexibly through association of a certain preparation state to the central segment of the k space.

Allocation of the slice counter cs to the geometric positions of the slices may be arbitrary (FIG. 4; right). All common slice excitation sequences conventionally used can therefore also be used in HoPE technology.

Multiple Preparations Per Repetition

To obtain contrast modification in all slices of a conventional multi-slice recording through chemical shift selective saturation, the relaxation time of the saturated signals must be shorter than the time interval between two preparations. In a T1 time of the fat tissue between 150 ms–200 ms, the method of single fat preparation per repetition is used only up to repetition times in the same order of magnitude. In spin echo sequences, which typically have a repetition time of approximately 500 ms, in contrast, fat saturation preparation is used directly before each individual spin echo acquisition. In general, this considerably prolongs the total measuring time per slice.

To reduce the time between two preparations, several equidistant preparations can be applied within one repetition time [8]. However, the possibility to apply P (P<N) preparations within a repetition time is limited in the conventional method through periodical signal modulations in the slice direction with a period length of N/P slices.

The HoPE condition for multiple preparations is the same as for individual preparation. All phase encoding steps with the same $k_y$ value must be acquired for all slices in the same preparation state. The number of possible preparation states is reduced from N to N/P.

The HoPE condition can be met separately for N/P slices in each case. This traces the problem back to the single preparation case. In each repetition, the same amount of N/P slices is read-out by different preparation states. The solution for these N/P slices can be copied for the other packets of N/P slices, which are acquired in the same repetition time.

Figure 5:
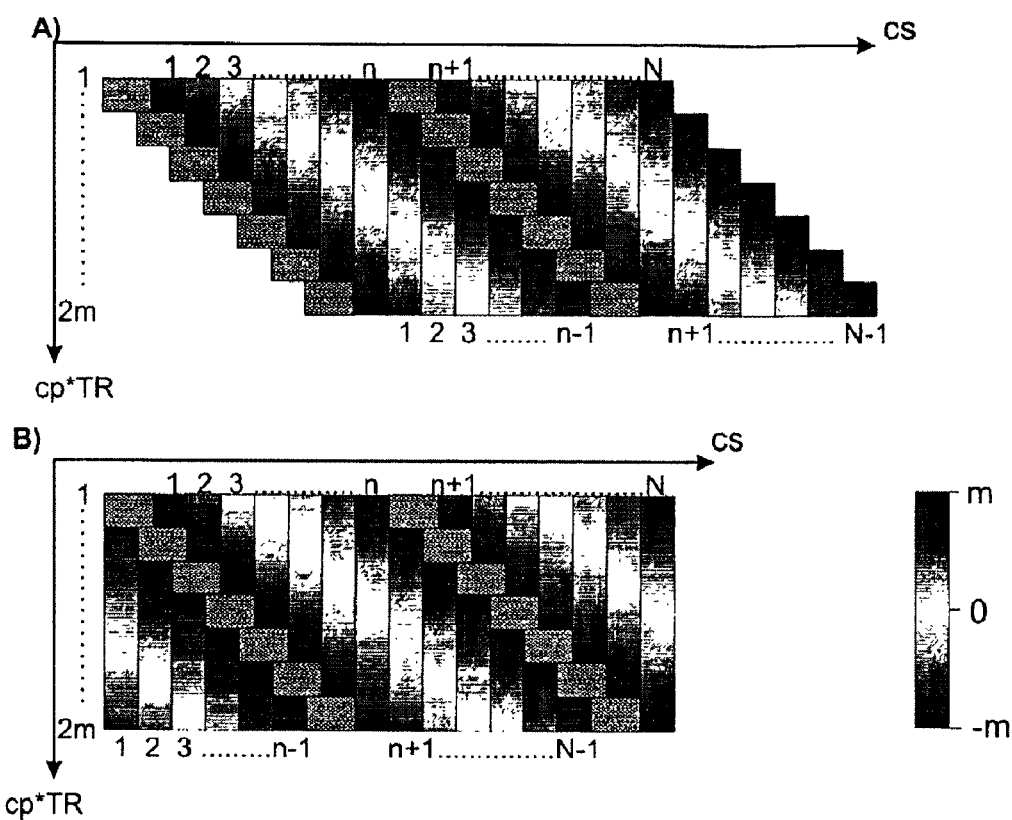
FIG. 5 generalization of the HoPE technology shown in FIG. 3 to a method with P magnetization preparations per repetition. The acquisition sequence of an acquisition with one preparation per repetition and n=N/P slices (FIGS. 3A and 3B) is copied correspondingly (P-1) times in the slice direction.

This is graphically shown in FIG. 5. The m phase encoding steps are divided into N/P segments each containing $$P * \frac{m}{N}$$

steps. Each segment is associated with one of the N/P preparation states. For the first N/P slices, the HoPE condition is met analogously to FIG. 3. This solution is copied (P-1) times in the slice direction to obtain the entire sequence of N slices.

Prevention of Artefacts

To minimize artefacts, the signal development in the phase encoding direction must be as smooth as possible. This is true for the signal development on the basis of magnetization preparation as well as for the signal development due to the used repetition times between two excitations of the same slice. The maximum smooth development of prepared signals is produced through linear phase encoding. This minimizes the number of jumps in the signal intensities along the phase encoding direction to N-1. These are produced at the transitions between the segments. The size of the jumps is minimized in that neighboring segments are associated with temporally adjacent preparation states. This condition is exactly met through linear allocation.

For a conventional multi-slice experiment, the following is true for all phase encoding steps of a slice: TR=N*TA+TP. Therein, TA is the time required for acquiring a phase encoding step and TP the time required for preparation. Signals from the first excitations of a slice are coded linearly from the edge of the k space to the inside for all slices to minimize artefacts due to initial signal fluctuations.

With the new acquisition sequence, the first repetitions include also acquisitions of phase encoding steps close to the center for some slices (FIG. 3A and FIG. 3B). To avoid artefacts in these slices, some so-called dummy echoes must be produced before the actual acquisition. These are echoes, which are not used for image reconstruction. For repetition times of typically more than 50 ms, the signal for most tissues reaches its equilibrium amplitude after a few TR intervals. This magnetization preparation avoids signal fluctuations in the acquired phase encoding steps.

The condition of a constant repetition time cannot be exactly met for the subsequently acquired phase encoding steps either. In case of change of the slice sequence or of the application time of the preparation, the TR intervals change between the two excitations of the same slice (FIG. 3A and FIG. 3B).

With the method of FIG. 3B, the repetition times for all slices along the phase encoding direction are constant except for each first phase encoding step in the columns below a preparation block. These have a repetition time TR=N*TA which is reduced by TP. They are encoded for all slices for the edge of the k space which minimizes the artefacts caused by the longer TR intervals.

With the method of FIG. 3A, the phase encoding steps have a different repetition time for all slices after each change of the slice sequence than in the other repetitions. The first N-1 phase encoding steps in the first repetition after a change in the slice sequence have a repetition time TR=(N-1)*TA+TP which is reduced by TA. They are encoded each at the edge of a segment. The relative difference in the repetition times ΔTR/TR between the first and following phase encoding steps of a segment is $$\frac{\Delta TR}{TR} = \frac{TA}{(N*TA)+TP} < \frac{1}{N}.$$

For multi-slice experiments with typically N>10 slices, this difference can be neglected to a good approximation.

The phase encoding step of the—after a change of the slice sequence—right outer slice has a repetition time of TR=(2N-1)*TA+TP. It is encoded for all slices at the edge of the k-space, thereby minimizing artefacts.

Signal differences, which occur between the first and following echoes of the segments can optionally be additionally reduced by introducing dummy repetitions analogously to the start of the acquisition before the acquisition of phase encoding steps with differing TR intervals.

REFERENCES

[1] Vlaardingerbroek, den Boer, Magnetic Resonance Imaging, Springer, 80f, 1999
[2] Rosen B R, Wedeen V J, Brady T J. Selective saturation NMR imaging. J Comput Assist Tomogr; 8:813–818; 1984
[3] Semelka R C, Chew W, Hricak H, Tomei E, Higgins C B. Fat-saturation MR imaging of the upper abdomen. AJR Am J Roentgenol; 155: 1111 1116; 1990
[4] Brateman L., Chemical Shift Imaging: A Review, AJR 146:971–980; 1986
[5] Bottomley P. A., Foster T H, Leue W M, In vivo nuclear magnetic resonance chemical shift imaging by selective irradiation. Proc. Natl. Acad. Sci. USA, 81: 6856–6860; 1984
[6] Norris D G, Reduced power multislice MDEFF imaging. J Magn Reson Imaging 11 :445–451; 2000
[7] Herlihy A H, Oatridge A, Curati W L, Puri P K, Bydder G M, Hajnal J V. FLAIR Imaging Using Nonselective Inversion Pulses Combined With Slice Excitation Order Cycling and k-Space Reordering to Reduce Flow Artifacts. MRM 46:354–364; 2001
[8] Finn J P, Thomasson D M, Moore J R, Purdy D E, Ascher S, Patt R, Laub G. Minimum-Cost Presaturation by Slice Segmentation in Fast 2-D Gradient-Echo Imaging. In: Proc 4th Annual Scientific Meeting ISMRM 1996. p 1475.

What is claimed is:

1. In a nuclear magnetic resonance (NMR) multi-slice complete image reconstruction method for recording signals from N slices (N>1) from an object wherein:
   m (m>1) repetition steps with different spatial encoding are acquired for each of the N slices such that after termination of the sequence a complete data set for image reconstruction is available,
   magnetization preparation is applied in the form of chemical shift selective saturation pulses,
   the magnetization preparation is applied P times ($1 \leq P < N$) in each repetition step in order to optimally saturate selected spins of one of the N slices in the object which results in perfect saturation only in one of the signals from one particular slice after each saturation pulse whereas from other slices are sub-optimally saturated, the improvement comprising:
   permuting a temporal sequence of the saturation pulses and/or a sequence of the acquisition of the differently spatially encoded signals of the individual slices whereby the allocation of spatial encoding steps to the differently spatially encoded signals of the individual slices is performed such that identical spatial encoding steps for each slice are acquired at identical delay times after the respective magnetization preparation pulses after termination of the m repetition steps, such that identical spatial encoding steps for each slice show identical saturation and therefore the saturation behavior is identical for all slices.

2. Method according to claim 1 wherein the permutation of the sequence of the acquisition of the differently spatially encoded signals of the individual slices is carried out such that the scheme of the temporal sequence between saturation pulses and the acquisition of the repetition steps is maintained during all m repetition steps, and wherein the sequence of the individual spatial encoding steps and the allocation of the N acquisition steps acting on the individual slices to the respective slices is varied.

3. Method according to claim 1, wherein the temporal sequence of the acquisition steps of the individual slices is maintained during the m acquisition steps, and permutation of the sequence of the acquisition of the differently spatially encoded signals of the individual slices is carried out through corresponding change of the point in time of application of the preparation relative to the acquisition steps of the individual slices.

4. Method according to claim 1, wherein RF pulses and temporally varying magnetic gradient fields are selected for spatial encoding according to the principle of the n-dimensional spatially resolved Fourier transformation method.

5. Method according to claim 1, wherein the sequences are spin echo sequences.

6. Method according to claim 1, wherein the sequences are gradient echo sequence which can be either a spoiled-FLASH, refocused FLASH, reversed FLASH or TrueFISP.

7. Method according to claim 1, wherein RARE-(TSE-) sequences are used, such that several differently spatially encoded pieces of data are acquired in each individual step.

8. Method according to claim 1, wherein the permutation of the sequence of the acquisition of the differently spatially encoded signals of the individual slices is carried out such that the scheme of the temporal sequence between saturation pulses and the acquisition of the repetition steps is maintained during all m repetition steps, wherein the sequence of the individual spatial encoding steps and the allocation of the N acquisition steps acting on the individual slices to the respective slices is varied, and wherein RF pulses and temporally varying magnetic gradient fields are selected for spatial encoding according to the principle of the n-dimensional spatially resolved Fourier transformation method.

9. Method according to claim 1, wherein the temporal sequence of the acquisition steps of the individual slices is maintained during the m acquisition steps, and permutation of the sequence of the acquisition of the differently spatially encoded signals of the individual slices is carried out through corresponding change of the point in time of application of the preparation steps relative to the acquisition steps of the individual slices, and wherein RF pulses and temporally varying magnetic gradient fields are selected for spatial encoding according to the principle of the n-dimensional spatially resolved Fourier transformation.

10. Method according to claim 1, wherein the permutation of the sequence of the acquisition of the differently spatially encoded signals of the individual slices is carried out such that the scheme of the temporal sequence between saturation pulses and the acquisition of the repetition steps is maintained during all m repetition steps, wherein the sequence of the individual spatial encoding steps and the allocation of the N acquisition steps acting on the individual slices to the respective slices is varied, and wherein spin echo sequences are used.

11. Method according to claim 1, wherein the temporal sequence of the acquisition steps of the individual slices is maintained during the m acquisition steps, and permutation of the sequence of the acquisition of the differently spatially encoded signals of the individual slices is carried out through corresponding change of the point in time of application of the preparation steps relative to the acquisition steps of the individual slices, and wherein spin echo sequences are used.

12. Method according to claim 1, wherein RF pulses and temporally varying magnetic gradient fields are selected for spatial encoding according to the principle of the n-dimensional spatially resolved Fourier transformation method, and wherein spin echo sequences are used.

13. Method according to claim 1, wherein the permutation of the sequence of the acquisition of the differently spatially encoded signals of the individual slices is carried out such that the scheme of the temporal sequence between saturation pulses and the acquisition of the repetition steps is maintained during all m repetition steps, wherein the sequence of the individual spatial encoding steps and the allocation of the N acquisition steps acting on the individual slices to the respective slices is varied, wherein RF pulses and temporally varying magnetic gradient fields are selected for spatial encoding according to the principle of the n-dimensional spatially resolved Fourier transformation method, and wherein spin echo sequences are used.

14. Method according to claim 1, wherein the temporal sequence of the acquisition steps of the individual slices is maintained during the m acquisition steps, and permutation of the sequence of the acquisition of the differently spatially encoded signals of the individual slices is carried out through corresponding change of the point in time of application of the preparation steps relative to the acquisition steps of the individual slices, and wherein RF pulses and temporally varying magnetic gradient fields are selected for spatial encoding according to the principle of the n-dimensional spatially resolved Fourier transformation method, and wherein spin echo sequences are used.

15. Method according to claim 1, wherein the permutation of the sequence of the acquisition of the differently spatially encoded signals of the individual slices is carried out such that the scheme of the temporal sequence between saturation pulses and the acquisition of the repetition steps is maintained during all m repetition steps, wherein the sequence of the individual spatial encoding steps and the allocation of the N acquisition steps acting on the individual slices to the respective slices is varied, and wherein a gradient echo sequence is used which can be either a spoiled-FLASH, refocused FLASH, reversed FLASH or trueFISP.

16. Method according to claim 1, wherein the temporal sequence of the acquisition steps of the individual slices is maintained during the m acquisition steps, and permutation of the sequence of the acquisition of the differently spatially encoded signals of the individual slices is carried out through corresponding change of the point in time of application of the preparation steps relative to the acquisition steps of the individual slices, and wherein a gradient echo sequence is used which can be either a spoiled-FLASH, refocused FLASH, reversed FLASH or trueFISP.

17. Method according to claim 1, wherein RF pulses and temporally varying magnetic gradient fields are selected for spatial encoding according to the principle of the n-dimensional spatially resolved Fourier transformation method, and wherein a gradient echo sequence is used which can be either a spoiled-FLASH, refocused FLASH, reversed FLASH or trueFISP.

18. Method according to claim 1, wherein the permutation of the sequence of the acquisition of the differently spatially encoded signals of the individual slices is carried out such that the scheme of the temporal sequence between saturation pulses and the acquisition of the repetition steps is maintained during all m repetition steps, wherein the sequence of the individual spatial encoding steps and the allocation of the N acquisition steps acting on the individual slices to the respective slices is varied, and wherein RARE(TSE) sequences are used, such that several differently spatially encoded pieces of data are acquired in each individual step.

19. Method according to claim 1, wherein the temporal sequence of the acquisition steps of the individual slices is maintained during the m acquisition steps, and permutation of the sequence of the acquisition of the differently spatially encoded signals of the individual slices is carried out through corresponding change of the point in time of application of the preparation steps of the individual slices, and wherein RARE(TSE) sequences are used, such that several differently spatially encoded pieces of data are acquired in each individual step.

20. Method according to claim 1, wherein RF pulses and temporally varying magnetic gradient fields are selected for spatial encoding according to the principle of the n-dimensional spatially resolved Fourier transformation method, and wherein RARE(TSE) sequences are used, such that several differently spatially encoded pieces of data are acquired in each individual step.

* * * * *

UNITED STATES PATENT AND TRADEMARK OFFICE
CERTIFICATE OF CORRECTION

PATENT NO.    : 6,888,349 B2
DATED         : May 3, 2005
INVENTOR(S)   : Hans-Peter Fautz It is certified that error appears in the above-identified patent and that said Letters Patent is hereby corrected as shown below:

Title page,
Item [56], References Cited, U.S. PATENT DOCUMENTS, enter the following:
-- 6,373,249 B1    4/2002    Kwok et al. ...................324/306
6,320,378 B1    11/2001    Maier et al. .....................324/307
5,729,138         3/1998    Purdy et al. .....................324/309
5,633,586         5/1997    Fin .............................324/309 --
OTHER PUBLICATIONS, enter the following:
-- Journal of Magnetic Resonance, Series B, Bd. 106, 181-186 (1995)
XP002229625
"Improved Water Suppression for Localized In Vivo 1H Spectroscopy" --

Signed and Sealed this

Twelfth Day of July, 2005

JON W. DUDAS
*Director of the United States Patent and Trademark Office*